United States Patent
Kojima et al.

(10) Patent No.: US 10,838,282 B2
(45) Date of Patent: Nov. 17, 2020

(54) OPTICAL RING CIRCUIT WITH ELECTRICAL FILTER

(71) Applicants: Mitsubishi Electric Research Laboratories, Inc., Cambridge, MA (US); Mitsubishi Electric Corporation, Tokyo (JP)

(72) Inventors: Keisuke Kojima, Weston, MA (US); Min Teng, Lafeyett, IN (US); Toshiaki Koike-Akino, Belmont, MA (US); Chungwei Lin, Boston, MA (US); Kieran Parsons, Cambridge, MA (US); Mitsunobu Gotoda, Tokyo (JP); Koichi Akiyama, Tokyo (JP)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/124,344

(22) Filed: Sep. 7, 2018

(65) Prior Publication Data
US 2019/0339584 A1 Nov. 7, 2019

Related U.S. Application Data

(60) Provisional application No. 62/666,988, filed on May 4, 2018.

(51) Int. Cl.
G02F 1/225 (2006.01)
H03H 17/06 (2006.01)
H03H 17/04 (2006.01)

(52) U.S. Cl.
CPC .......... *G02F 1/2257* (2013.01); *H03H 17/04* (2013.01); *H03H 17/06* (2013.01)

(58) Field of Classification Search
None
See application file for complete search history.

(56) References Cited

U.S. PATENT DOCUMENTS 6,343,207 B1 * 1/2002 Hessel ............... H04B 1/0003
455/552.1
9,651,803 B2 5/2017 Abiri et al.
(Continued)

FOREIGN PATENT DOCUMENTS

WO 2016149524 A1 3/2016

OTHER PUBLICATIONS

Baba et al., "50-Gb/s Ring-resonator based silicon modulator." May 8, 2013; revised May 2, 2013; accepted May 2, 2013; published May 8, 2013 (C) 2013 OSA May 20, 2013 | vol. 21, No. 10 | DOI:10.1364/OE.21.011869 | Optics Express 11869.

*Primary Examiner* — Tina M Wong
(74) *Attorney, Agent, or Firm* — Gennadiy Vinokur; Hironori Tsukamoto; James McAleenan

(57) ABSTRACT

An optical ring circuit for modulating light from a light source into an optical signal includes a ring modulator located near a waveguide to couple a light propagating the waveguide, the ring modulator including a pair of electrodes, a signal generator to transmit an electrical signal corresponding to the optical signal, a filter circuit to generate an output signal, wherein the filter circuit includes an adder unit and at least one tap unit having a delay unit and a coefficient unit, wherein the adder unit adds the electrical signal from the signal generator and a signal passed from the tap unit for pre-compensating signal components of the electrical signal by at least twice delay time of the delay unit, and a driver circuit to apply a voltage to the electrodes based on the output signal.

6 Claims, 11 Drawing Sheets

(56) References Cited

U.S. PATENT DOCUMENTS

| | | | |
|---|---|---|---|
| 10,084,619 B2* | 9/2018 | Dupuis | H04L 25/03076 |
| 10,120,210 B2* | 11/2018 | Dupuis | G02F 1/0121 |
| 2002/0097861 A1* | 7/2002 | Story | H04M 9/08 |
| | | | 379/387.02 |
| 2009/0231686 A1 | 9/2009 | Atkins et al. | |
| 2010/0046958 A1 | 2/2010 | Awadalla et al. | |
| 2010/0129088 A1* | 5/2010 | Akasaka | H04B 10/50577 |
| | | | 398/188 |
| 2014/0341497 A1* | 11/2014 | Liu | G02F 1/015 |
| | | | 385/3 |
| 2015/0295650 A1 | 10/2015 | Lee et al. | |
| 2016/0282700 A1* | 9/2016 | Nedovic | G02F 1/2257 |
| 2017/0351122 A1 | 12/2017 | Dupuis et al. | |
| 2017/0353333 A1* | 12/2017 | Dupuis | H04L 25/03076 |
| 2019/0339584 A1* | 11/2019 | Kojima | H03H 17/06 |

\* cited by examiner

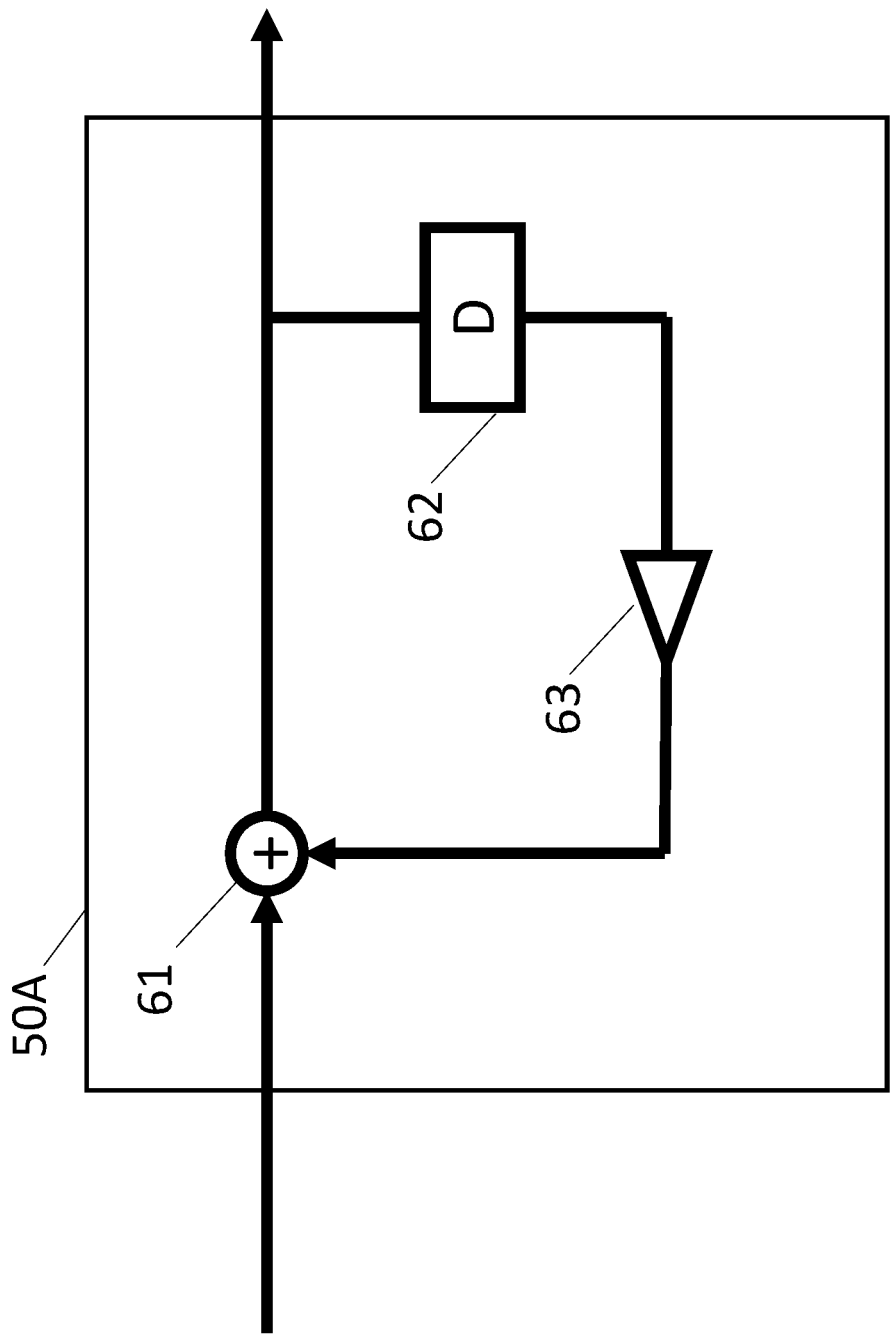

OPTICAL RING CIRCUIT WITH ELECTRICAL FILTER

FIELD OF THE INVENTION

This invention generally relates to Optical ring circuit with electrical filter.

BACKGROUND OF THE INVENTION

Mach-Zehnder modulators are widely used modulator used for high-speed optical communications, and are nearly ideal in terms of modulation characteristics. The basic principle is to accumulate phase shift along mm long Mach-Zehnder arms, which dictates its very large footprint. Although they do not have inherent optical bandwidth limitation, their very long waveguides as well as a pair of 3 dB couplers contribute to large optical loss.

On the other hand, optical ring modulators are compact modulators and are suitable for photonic integrated circuits. In these modulators, phase shift can be amplified by the cavity resonance effect without relying on long distance propagation. However, ring modulator suffers from trailing edge distortion due to the memory effect of the ring modulator, because the light recirculates in the ring during modulation and a small amount of modulated output remains even after the modulation signal disappears, causing signal distortion from a trailing edge.

Compensating the signal distortion can be addressed at the receiver side. However, heavily distorted signals cannot be fully compensated due to the limited range of analog-to-digital converters and following signal processing circuit. The receiver-side compensation also heavily increases part of the frequency component of the noise, leading to degraded signal quality. Therefore, it is highly desirable to pre-compensate at the transmitter side, while minimizing the reliance on the compensation at the receiver side.

SUMMARY OF THE INVENTION

Some embodiments of the present disclosure are based on recognition that optical ring circuit output signal distortion in the signal tail can be compensated by an electric signal input which contain slowly varying signal.

In according to some embodiments of the present disclosure, the electrical input signal can be generated by an Infinite Impulse Response filter (IIR filter) or a Finite Impulse Response filter (FIR filter).

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

The presently disclosed embodiments will be further explained with reference to the attached drawings. The drawings shown are not necessarily to scale, with emphasis instead generally being placed upon illustrating the principles of the presently disclosed embodiments.

FIG. 2 is a schematic of an IIR filter circuit;

Figure 1A:
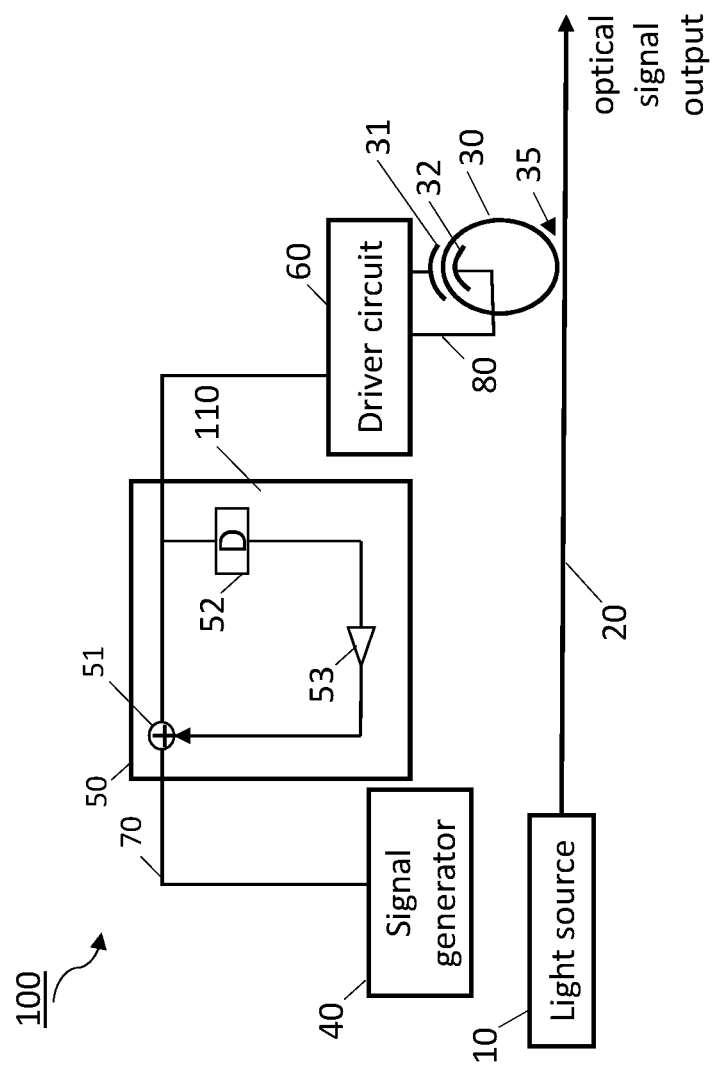
FIG. 1A shows a schematic of an optical modulation circuit including an optical ring modulator and an electrical IIR filter.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process, which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

FIG. 1A shows a schematic of an optical ring circuit 100. A light source 10 is a device to serve beam of light. An input waveguide 20 guides the beam of light.

The optical ring circuit 100 modulates light from a light source 10 into an optical signal.

A signal generator 40 makes electrical signals. The electrical signals are corresponded to the optical signals.

An electrical filter circuit 50 generates an outputs signals from the electrical signals. The electrical filter circuit 50 may contain a delay unit 52, coefficient unit (also called coefficient multiplier) 53, and an adder unit 51. The adder unit adds the electrical signals from the signal generator 40 and signals passed from the tap unit. Here, the electric filter circuit 50 is described as an IIR (Infinite Impulse Response) filter, but the invention is not limited to the IIR filter, and an FIR (Finite Impulse Response) filter may be applied. A driver circuit 60 amplifies the output signals from the electric filter circuit 50. A driver circuit 60 applies a voltage to the electrodes 31 and 32 on the output signal.

An optical ring modulator 30 modulates beam of light from the light source 10. The optical ring modulator 30 is a compact modulator and is suitable for photonic integrated circuits. In the modulator 30, phase shift can be performed by the cavity resonance effect without relying on long distance propagation. Modulator electrodes 31 and 32 modulate the refractive index of the optical ring modulator 30. The optical ring modulator 30 are located near a waveguide 20 to couple the light propagating the waveguide 20. The optical modulator has the pair of electrodes 31 and 32. A directional coupler 35 is part of the optical ring modulators 30.

The flow of signals from the signal generator 40 will be described below. The signal generator 40 generates electrical signals corresponding to data to be transmitted via the optical modulation circuit 100. The electrical filter circuit 50 receives the electrical signals from the signal generator 40 and modifies the electrical signals to the output signals.

The output signals (the modified signals) include a series of signals (eg. Signals 711-720 in FIG. 3), in which the first signal of them is stronger than others, and the signals after the first signal are weakened on intervals of the time. The driver circuit 60 receives the output signals from the electrical filter circuit 50.

The driver circuit 60 feeds the received output signals to apply to a pair of electrode 31 and 32 of the optical ring modulator 30. In this case, the driver circuit 60 converts to the signals amplitude level and impedance for the ring modulator 30 through an electrical path 80, the modulation voltage is applied to the modulator electrodes 31 and 32.

Figure 1B:
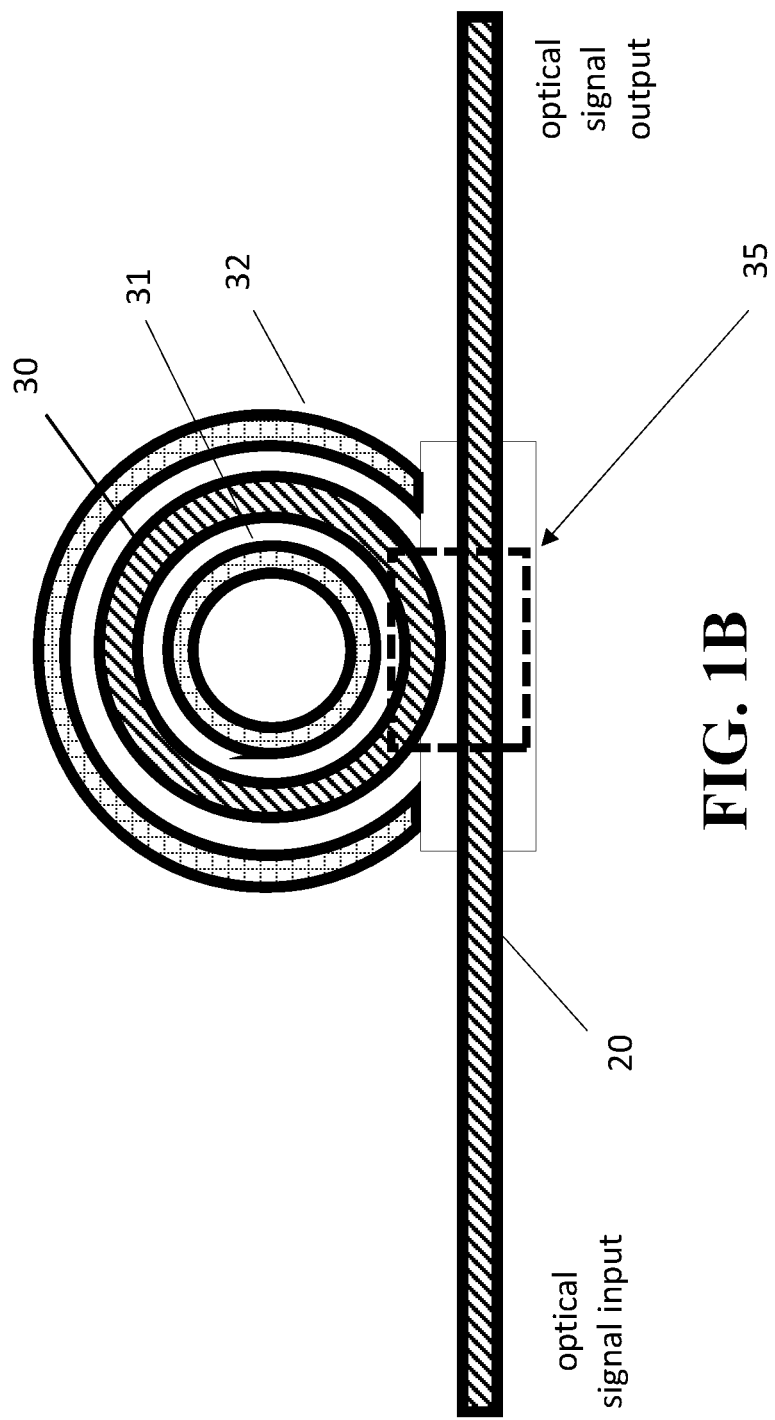
FIG. 1B shows a schematic of an optical ring modulator.

FIG. 1B is an expanded view of the optical ring modulator 30. The light from the light source 10 goes through the input waveguide 20, and through the directional coupler 35, part of the light is coupled into the optical ring 30. The refractive index of the optical ring modulator 30 is modulated by the applied voltage between the two modulator electrodes 31 and 32, modifying the interference condition when the light circulating back to the directional coupler 35. The optical ring modulator 30 can be of the type of, but not limited to, carrier depletion modulator, carrier injection modulator, quantum confined stark effect modulator.

The radius of the optical ring modulation 30 is typically 20 μm to 100 μm for silicon waveguides and 50 μm to 200 μm for InP/InGaAsP waveguides, corresponding to the round trip time of the order of 1 ps to 10 ps. Therefore, the long tail can be of the order of tens to hundreds of picoseconds. The ring radius and modulation speed is in a trade-off. The smaller the optical ring modulator 30, the higher the modulation speed. However, at the same time, the length of the optical modulator ring 30 is shorter, thus requiring higher modulation voltage. Therefore, it is desirable to have a larger ring radius to allow for lower modulator voltage.

The shape of the ring is not limited to a circular shape. It can be an oval shape, allowing a directional coupler to have two straight parallel waveguides.

FIG. 2 is a schematic of an IIR filter circuit 50A. The IIR filter circuit 50A has an adder unit 61, a delay unit 62, and a coefficient unit 63 (For convenience, one delay unit 61 and one coefficient unit 63 are referred to as tap unit). The delay unit 62 receives and delays the electrical signals from the adder unit 61. The coefficient unit 63 receives and multiplies the predetermined coefficient to the signals from the delay unit 62. The adder unit 61 receives and adds the electrical signals from the signal generator 40 and the signals from the coefficient unit 63.

The driver circuit 60 (in FIG. 1A) receives the output signals from the IIR filter circuit 50A. In this example, the electrical signals are modified by the delay unit 62 first and then by the coefficient unit 63. But the invention is not limited to this, and the order may be reversed. For instance, the adder unit 61 adds the electrical signal from the signal generator 40 and the signal passed from the tap unit including the delay unit 62 and one coefficient unit 63 for pre-compensating signal components of the electrical signal of the signal generator 40 by at least twice delay time of the delay unit 62.

Figure 3:
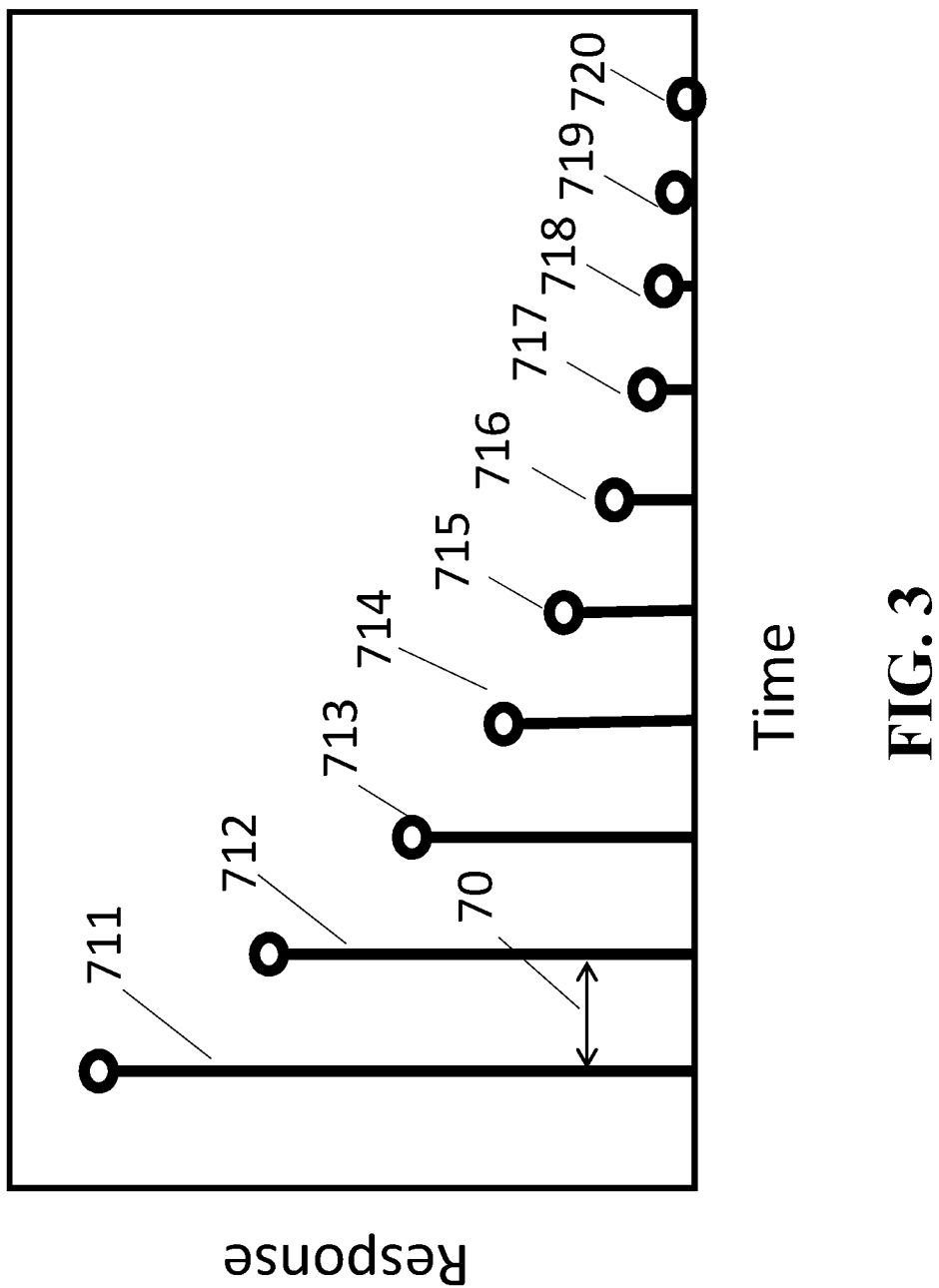
FIG. 3 is an output (response) of an IIR circuit, when a single impulse is applied.

FIG. 3 is the output signals of an IIR circuit 50A when a single impulse is applied, wherein the non-delayed signal 711 and delayed signals 712, 713 . . . 720 are shown, and the delay time 70 corresponding to the delay time of the delay unit 62. In this case, the IIR filter circuit 50A operates is adequately for pre-compensating signals of the optical ring modulator with long tails.

The advantage of this configuration is that the optical ring modulator 30 is smaller than a Mach-Zehnder modulator. Moreover, the electrical signal passes through the electrical filter circuit 50, to compensate for the optical modulator characteristics, and generate the desired optical signal.

Figure 4:
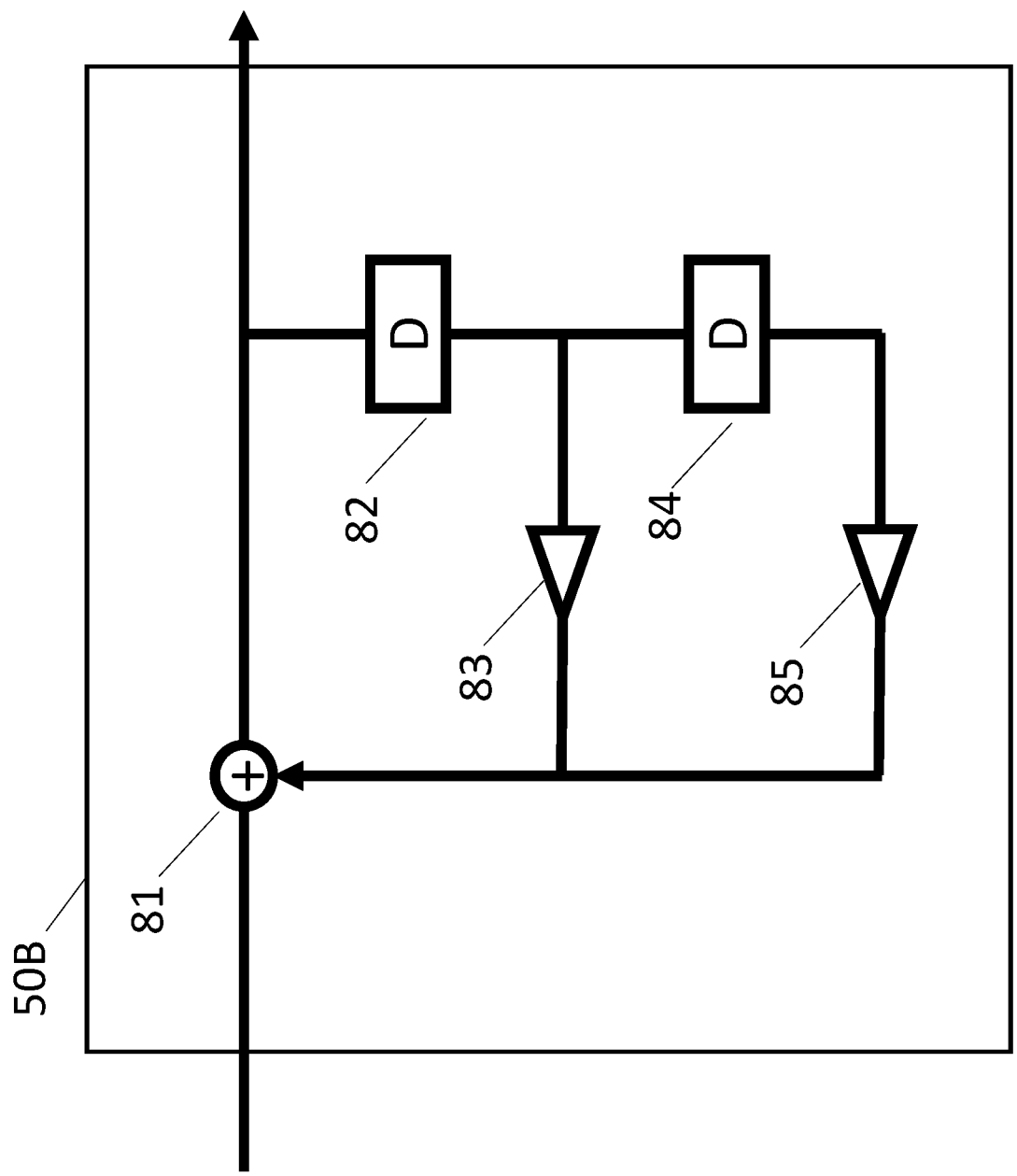
FIG. 4 is a schematic of an IIR filter circuit with two delay units and two coefficient units.

FIG. 4 is a schematic of an IIR filter circuit 50C. The IIR filter circuit 50C has two delay units 82, 84, two coefficient units 83, 85, and one added unit 81. The delay unit 82 receives and delays the electrical signals from the signal generator 40. The coefficient unit 83 receives and multiplies the predetermined coefficient to the signals from the delay unit 82. The delay unit 84 receives and delays the signals from the delay unit 82. The coefficient unit 85 receives and multiplies the predetermined coefficient to the signals from the delay unit 84. The adder unit 61 receives and adds the electrical signals from the signal generator 40, the signals from the coefficient unit 83, and the signals from the coefficient unit 85. The coefficient of coefficient units 81 and 85 may be different.

The filter circuit 50C has two or more tap units and the adder 81, the tap units. First tap unit includes the delay 82 and the coefficient unit 83, second tap unit includes the delay 84 and the coefficient unit 85) are arranged in parallel.

By using the filter as shown in FIG. 4, an electrical signal can be controlled by two adjustable parameters in the coefficient unit 83 and 85, and two delay units 82 and 84. Therefore, the modulator response can be more precisely compensated with additional longer response time component, compared to the one shown in FIG. 2.

Figure 5:
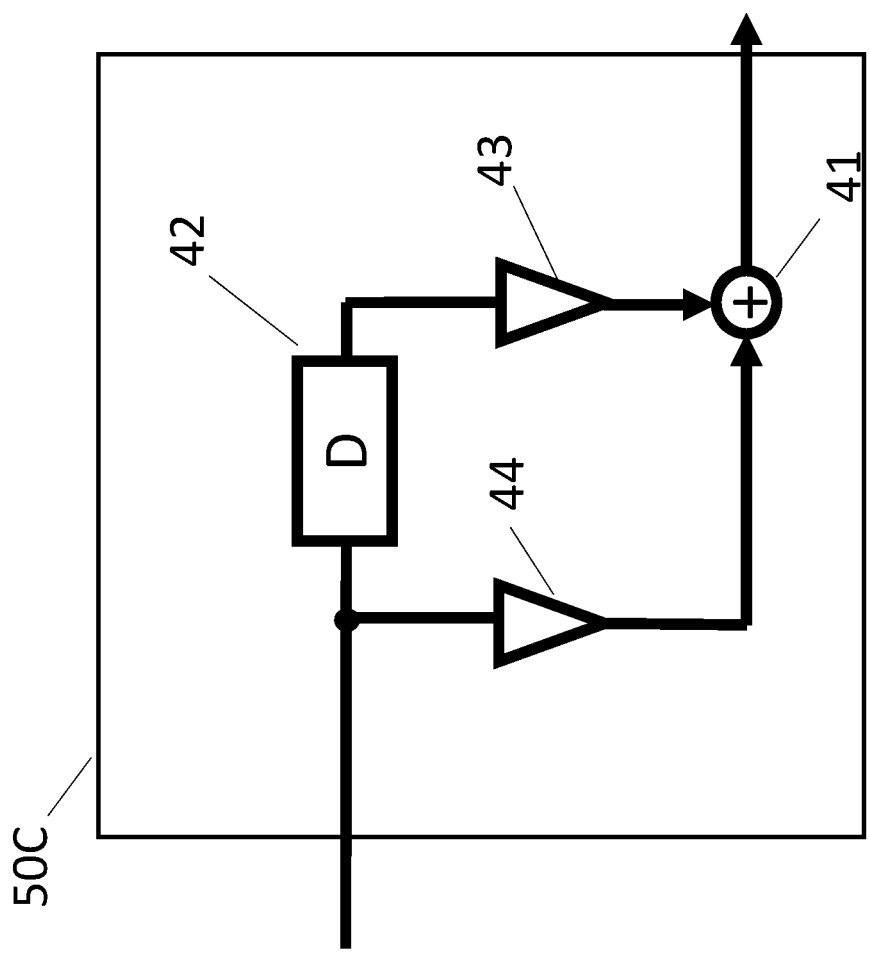
FIG. 5 is a schematic of an FIR circuit with two tap units.

FIG. 5 is a schematic of an FIR circuit 50C. The FIR circuit 50C generates output signals The IIR filter circuit 50C has one delay units 42, two coefficient units 43 and 44, and one added unit 41. The coefficient unit 44 receives and multiplies the predetermined coefficient to the electrical signals (non-delayed signals) from the signal generator 40. The delay unit 42 receives and delays the electrical signal (non-delayed signal) from the signal generator 40. The coefficient unit 43 receives and multiplies the predetermined coefficient to the signal from the delay unit 42. The adder unit 41 receives and adds the electrical signals from the coefficient unit 43 and the coefficient unit 44.

FIR filter circuit 50A is a simple filter with good stability. However, it has limited capability of compensation.

The FIR circuit 50C has the adder unit 41, the first coefficient unit 43, and at least one tap unit having the delay unit 42 and a second coefficient unit 43. The adder unit 41 adds signals passed from the signal generator 40 and the first coefficient unit 44, and signals passed from the signal generator 40 and tap unit (the adder 42 and the coefficient unit 43).

Figure 6:
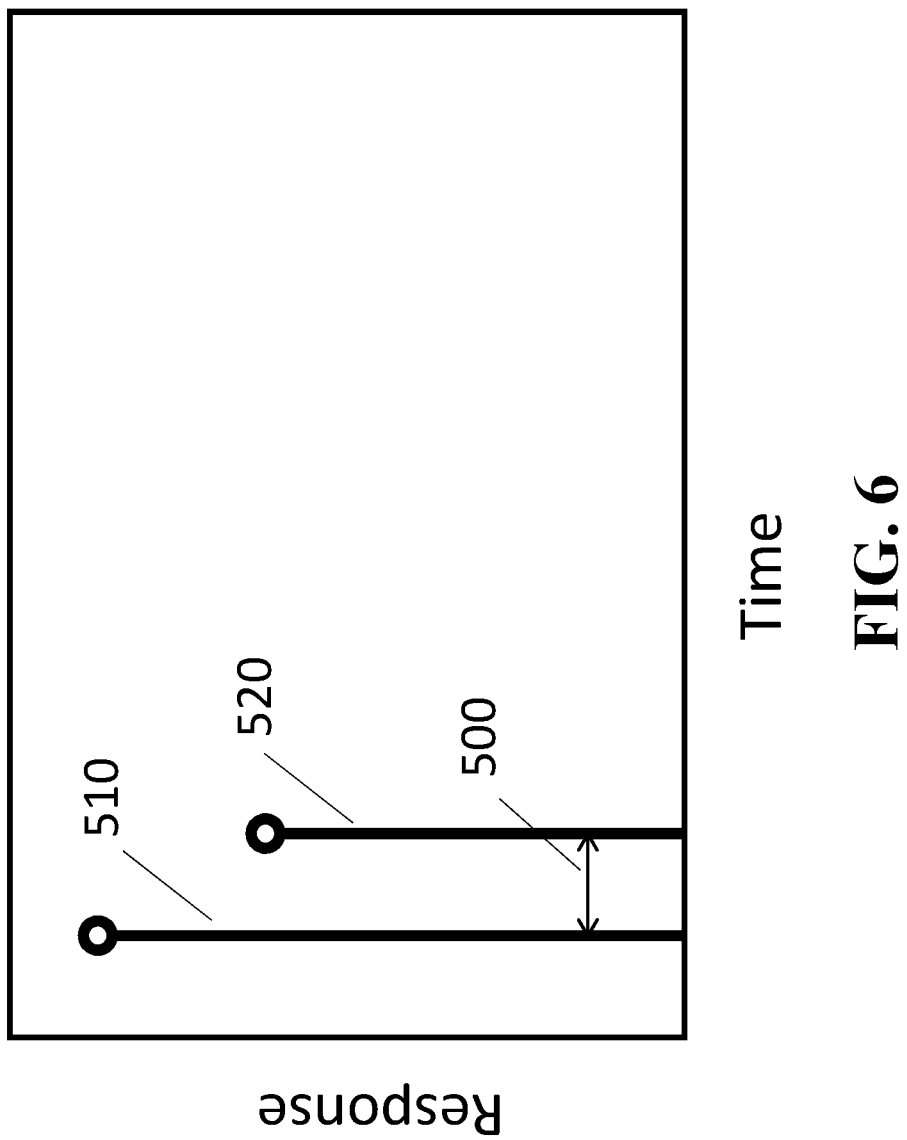
FIG. 6 is an output of an FIR circuit, when a single impulse is applied.

FIG. 6 is the output signals of an FIR circuit 50C when a single impulse is applied, wherein the non-delayed signal 510 and delayed signal 520 are shown, and the delay time 500 corresponding to the delay time of the delay unit 42. As indicated in the figure, the output shows that this type of filter can generate two step compensation, and not adequate for pre-compensating optical ring modulators with long tail output, considering that the optical signal trail can be of the order of tens to hundreds of picoseconds, while the single electrical delay can be of the order of 10-20 ps.

Figure 7:
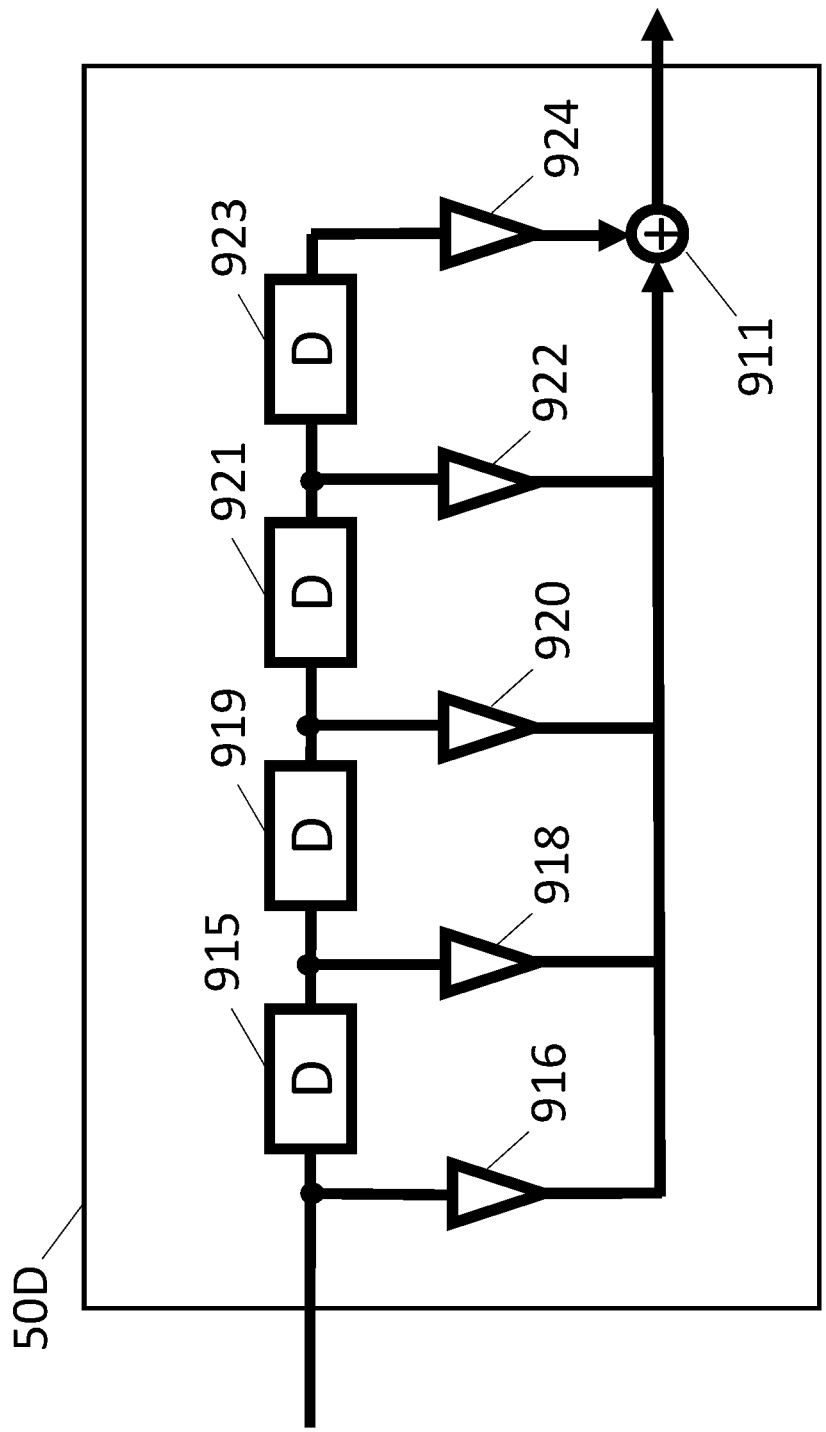
FIG. 7 is a schematic of an FIR circuit with two four delay units and five coefficient units.

FIG. 7 is a schematic of an FIR circuit 50D. The FIR circuit 50D has four delay units, five coefficient units and one added unit.

The delay unit 915 receives and delays the electrical signals from the signal generator 40. The delay unit 919 receives and delays the electrical signals from the delay unit 915. The delay unit 921 receives and delays the electrical signals from the delay unit 919. The delay unit 923 receives and delays the electrical signals from the delay unit 921.

On the other hand, the coefficient unit 916 receives and multiplies the predetermined coefficient to the electrical signals from the signal generator 40. The coefficient unit 918 receives and multiplies the predetermined coefficient to the electrical signals from the delay unit 915. The coefficient unit 920 receives and multiplies the predetermined coefficient to the electrical signals from the delay unit 919. The coefficient unit 922 receives and multiplies the predetermined coefficient to the electrical signals from the delay unit 921. The coefficient unit 924 receives and multiplies the predetermined coefficient to the electrical signals from the delay unit 923. The adder unit 911 receives and adds the electrical signals from the coefficient unit 916, 918, 920, 922 and 924. In this case, the magnitude of the coefficient is explained as the coefficient unit 916> the coefficient unit 918> the coefficient unit 920> the coefficient unit 922> the coefficient unit 922, but the invention is not limited by it.

The FIR circuit 50D has two or more tap units. The first coefficient 916, and the tap units (pair of the delay unit 915 and the coefficient unit 918, the delay unit 919 and the coefficient unit 920, the delay unit 921 and the coefficient unit 922, and the delay unit 923 and the coefficient unit 924) are arranged in parallel.

Figure 8:
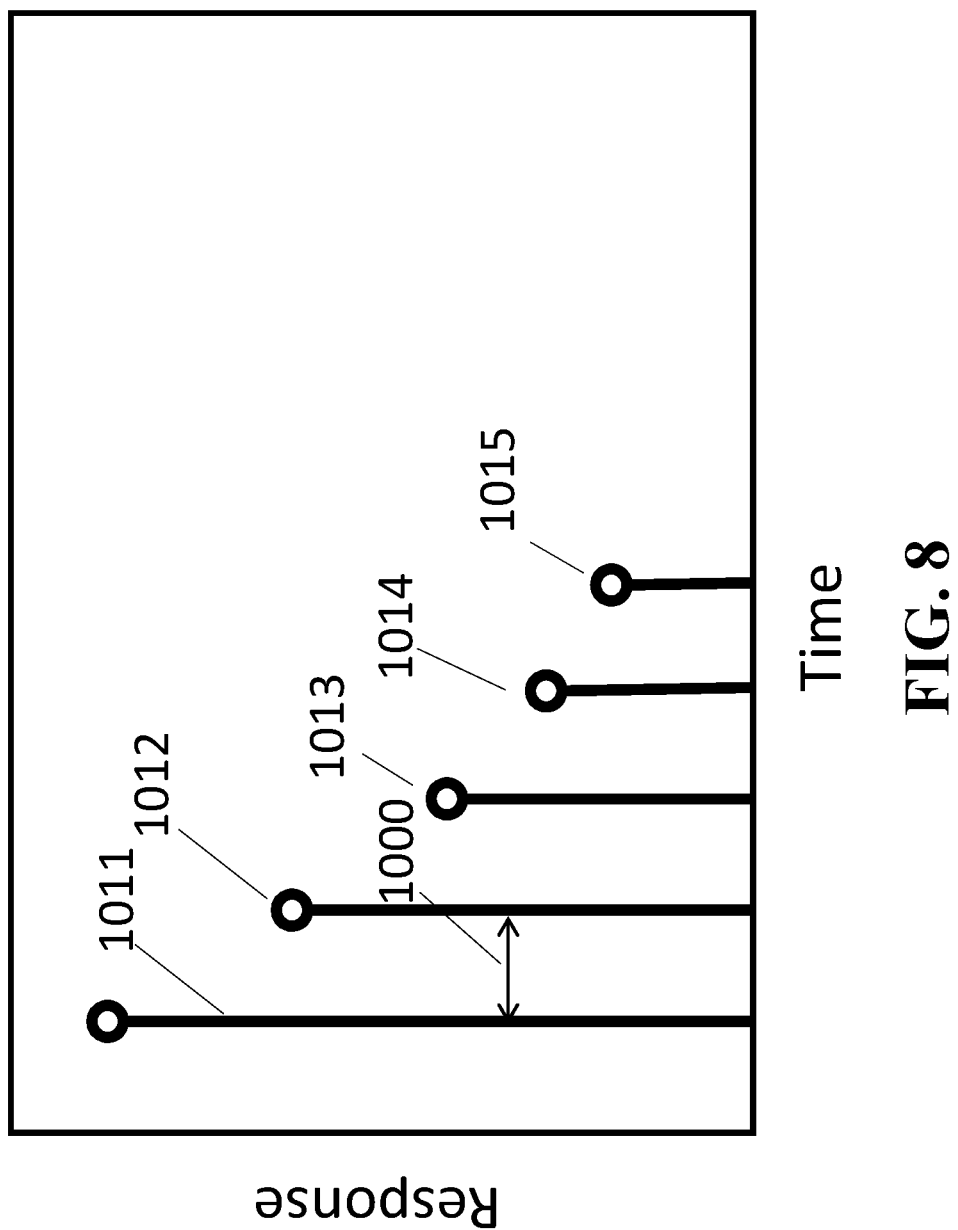
FIG. 8 is an output of an IIR circuit with two 4 delay units and 5 coefficient units.

FIG. 8 is an output of an FIR circuit 50D when a single impulse is applied, wherein the non-delayed signal 1011 and delayed signals 1012, 1013, 1014, and 1015 are shown, with the delay time 1000 corresponding to the delay time D of the delay units 915, 919, 921, and 923.

The FIR circuit 50D has the coefficient units after each delay units, and they can generate a signal with longer time period. Therefore, it can compensate much longer time response with more freedom to adjust the amplitude at each time slot, compared to the FIR filter circuit 50A.

Figure 9:
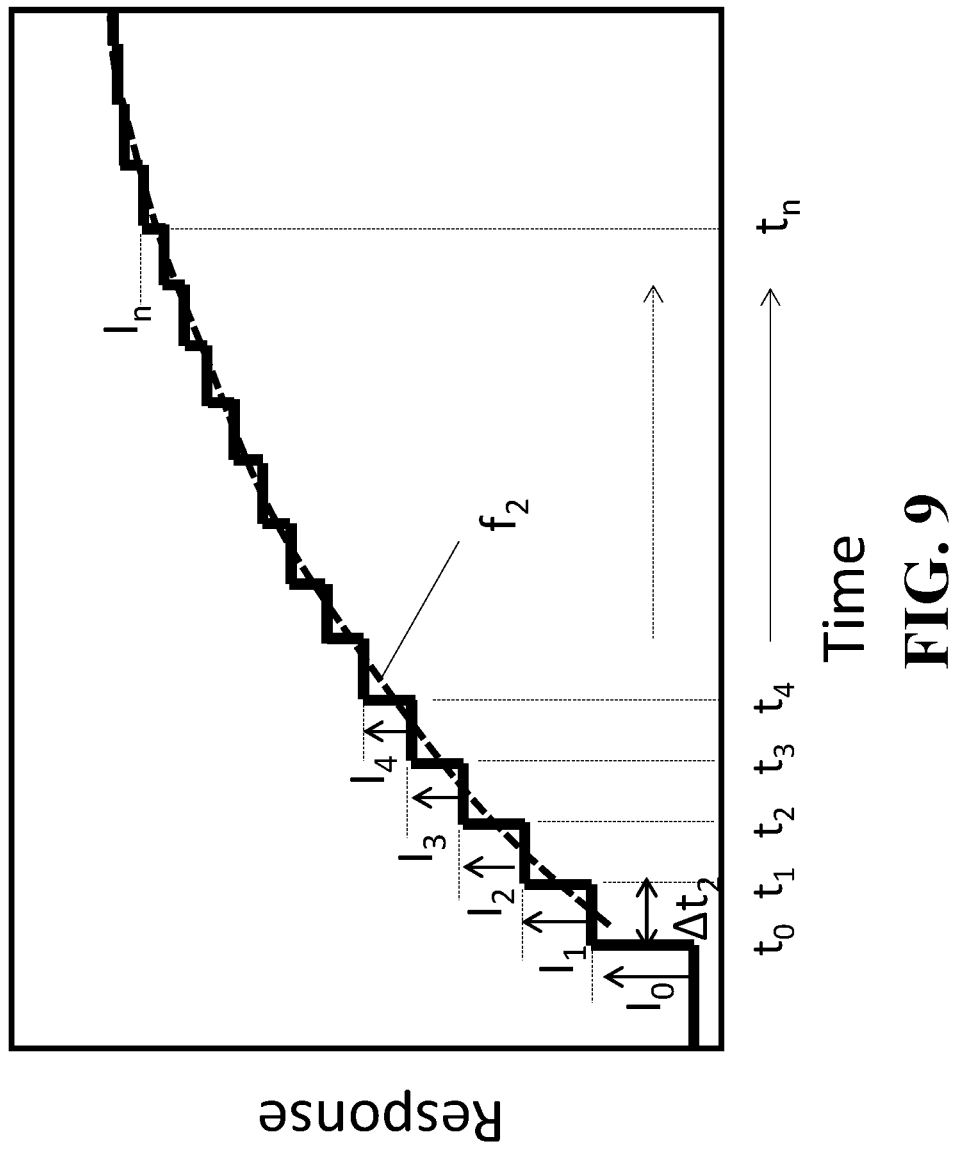
FIG. 9 shows an optical signal response when a step function voltage is applied to the ring modulator.

FIG. 9 is an optical signal response when a step function voltage is applied to the ring modulator. The output optical signal increases first by $I_0$ at $t=t_0$, and after the round trip time $\Delta t_2$, by $I_1$ at $t=t_1$, and so on. The output signal can be represented by an envelope function $f_2$.

Even though FIG. 9 shows an example of a rising edge step function input voltage, similar figure can be obtained for a falling edge step function voltage. In that case, the figure is a vertical mirror image of FIG. 9.

The above example shows a step function input, however, in real communications, the input signals are mixture of rising edge and falling edge signals. This includes non-return-to zero (NRZ) and multi-level pulse amplitude modulation (PAM) signals such as PAM4 or PAM8. This long tail overlaps with several succeeding pulses, causes signal distortion and causes severe eye closure especially for PAM4 and PAM8 signals.

Figure 10:
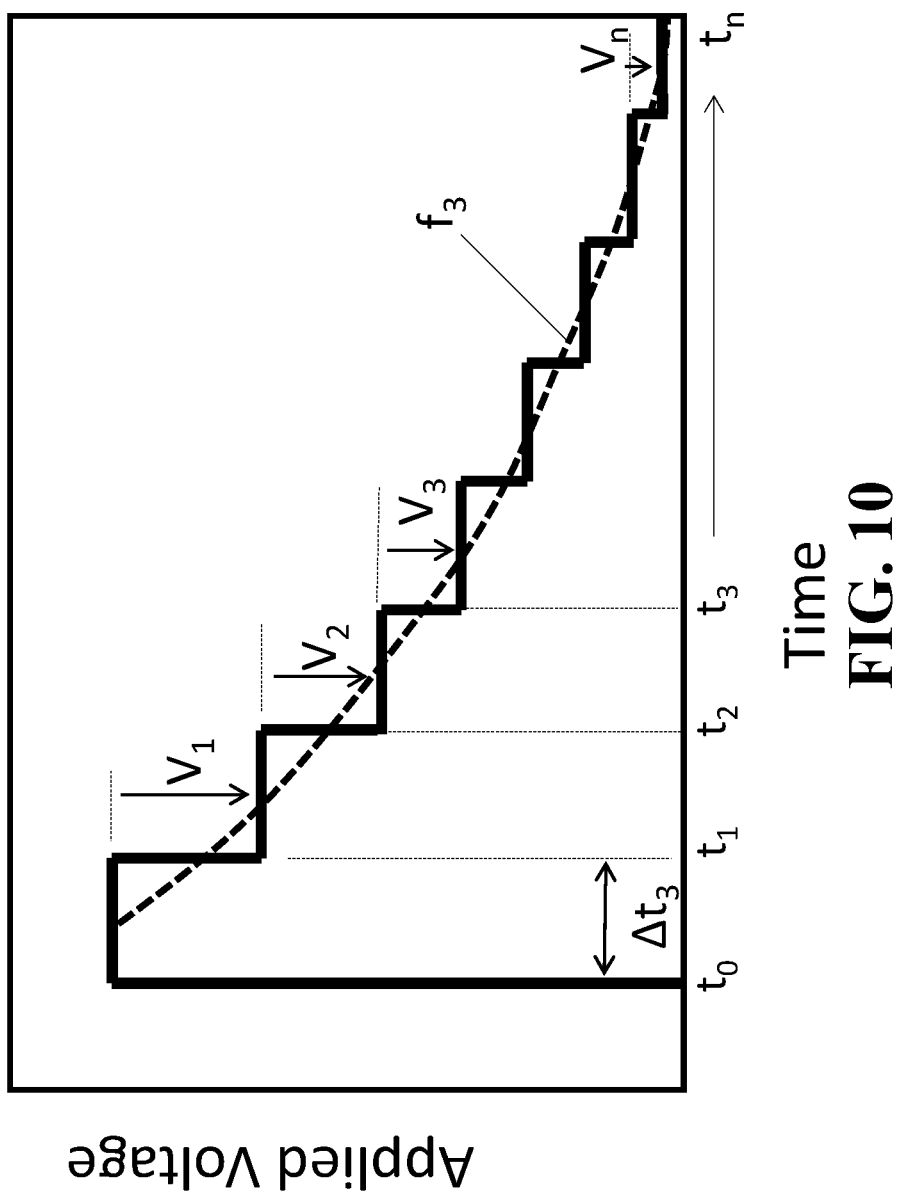
FIG. 10 shows an expected electrical signal after a pre-compensation electrical circuit to be applied to the optical ring modulator.

FIG. 10 is an expected electrical signal to be applied to the optical ring modulator with a pre-compensation. The envelope function $f_3$ of the electrical signal needs to be close to the vertical mirror image of $f_2$. In this case, the optical signal output is nearly equal to a step function. The time step $\Delta t_3$ is the same as the time delay D in the delay unit. $\Delta t_3$ can typically of 10-20 ps, corresponding to 56-112 GBd modulation speed.

Even though FIG. 10 shows an example of rising edge step function, similar figure can be obtained for a falling edge step function voltage.

With this example circuit, five consecutive pulses with decaying amplitude can be generated. This means, the distortion caused by the recirculating light within the optical ring modulator can be pre-compensated to a certain degree with a FIR filter. By further increasing the number of taps, more precise pre-compensation can be realized.

Although we have discussed to use the optical ring modulators as example, the pre-compensation technique described above can be applied for disk resonators and the combination of optical ring modulators.

We claim:

1. An optical ring circuit for modulating light from a light source into an optical signal, comprising:
   a ring modulator located near a waveguide to couple light propagating the waveguide, the ring modulator including a pair of electrodes;
   a signal generator to transmit an electrical signal corresponding to the optical signal;
   an infinite impulse response filter circuit to generate an output signal, wherein the filter circuit includes an adder unit and at least one tap unit having a delay unit and a coefficient unit, wherein the adder unit is configured to receive and add the non-delayed electrical signal from the signal generator and a modified feedback signal passed through the delay unit and the coefficient unit in the at least one tap unit for pre-compensating signal components of the electrical signal by at least twice delay time of the delay unit; and a driver circuit to apply a voltage to the electrodes based on the output signal.

2. The optical ring circuit of claim 1, wherein the filter circuit comprises an Infinite Impulse Response filter including one or more tap units.

3. The optical ring circuit of claim 1, wherein the filter circuit comprises a Finite Impulse Response filter including two or more tap units, wherein the adder unit and the tap units are arranged in parallel.

4. An optical ring modulator for modulating light from a light source into an optical signal, comprising:

a ring modulator located near a waveguide to couple light propagating the waveguide, the ring modulator including a pair of electrodes;

a signal generator to transmit an electrical signal corresponding to the optical signal;

an infinite impulse response filter circuit to generate an output signal, wherein the filter circuit includes an adder unit, a first coefficient unit, and at least one tap unit having a delay unit and a second coefficient unit, wherein the adder unit is configured to receive and add a non-delayed signal from the signal generator and a first modified feedback signal passed from the first coefficient unit and a second modified feedback signal passed from the delay unit and the second coefficient unit in the at least one tap unit for pre-compensating signal components of the electrical signal by at least twice delay time of the delay unit; and a driver circuit to apply a voltage to the electrodes based on the output signal.

5. The optical ring modulator of claim 4, wherein the filter circuit comprises an Infinite Impulse Response filter including one or more tap units.

6. The optical ring modulator of claim 4, wherein the filter circuit comprises a Finite Impulse Response filter including two or more tap units, wherein the adder unit and the tap units are arranged in parallel.

* * * * *